US006956375B2

(12) United States Patent
Shi et al.

(10) Patent No.: US 6,956,375 B2
(45) Date of Patent: Oct. 18, 2005

(54) MAGNETIC RESONANCE IMAGING MAGNETIC FIELD GENERATOR

(75) Inventors: Shaohui Shi, Wuxi (CN); Baba Misao, Wuxi (CN); William Chen, Wuxi (CN); Weijun Shen, Florence, SC (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 10/707,768

(22) Filed: Jan. 9, 2004

(65) Prior Publication Data

US 2005/0151540 A1 Jul. 14, 2005

(51) Int. Cl.7 ................................................ G01V 3/00

(52) U.S. Cl. ...................................... 324/319; 324/318

(58) Field of Search ............................... 324/319, 318, 324/322, 309, 307, 300; 335/297; 600/410

(56) References Cited

U.S. PATENT DOCUMENTS

| | | | | |
|---|---|---|---|---|
| 4,900,965 | A * | 2/1990 | Fisher | 310/216 |
| 5,317,297 | A * | 5/1994 | Kaufman et al. | 335/297 |
| 6,259,252 | B1 * | 7/2001 | Laskaris et al. | 324/319 |
| 6,694,602 | B2 * | 2/2004 | Laskaris et al. | 29/602.1 |

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

A magnetic field generator assembly includes a plurality of magnetic elements configured to collectively generate a magnetic field sufficient for diagnostic data acquisition and a non-magnetizable pane operationally connected to limit separation of one magnetic element from another magnetic element. Accordingly, the multi-element magnetic field generator is efficiently secured against deterioration often associated with prolonged exposure to high order magnetic fields.

23 Claims, 4 Drawing Sheets

MAGNETIC RESONANCE IMAGING MAGNETIC FIELD GENERATOR

BACKGROUND OF INVENTION

The present invention relates generally to magnetic field generators for magnetic resonance imaging (MRI) devices and systems, and, more particularly, to a system and method of assembling a single polepiece from a plurality of magnetic tiles such that the tiles of the polepiece are restricted from disassembly.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

To generate these high uniform magnetic fields, many MRI systems utilize a permanent magnet system capable of generating a uniform magnetic field on the order of 0.2 to 0.5 Tesla and higher within a pre-determined space or imaging volume. Generating the desired magnetic field during an MRI process induces electric eddy currents on the permanent magnet system. These electric eddy currents can create distortion in the imaging data that may serve to severely degrade the quality of a reconstructed image. To limit the induction of eddy currents during MRI imaging, the permanent magnet system may be constructed of multiple blocks or tiles that are, in turn, constructed of thin, stacked, sheets or laminates. The laminates are typically bonded together to form a single laminate structure.

Since the tiles are typically fabricated or otherwise formed of a ferromagnetic magnetic material and the tiles are exposed to strong magnetic fields during imaging, the large magnetic forces generated may act upon tiles in an undesirable manner. That is, over time the magnetic forces may cause the tiles to pull apart or delaminate. To counter the impact of these magnetic forces, the tiles are generally bonded together. Ideally, the bonding strength between tiles would be sufficient to counter the delaminating forces imposed by the strong magnetic fields. To sufficiently bond the layers, however, requires that each and every tile and every layer of each tile be sufficiently bonded. To ensure that the adjacent tiles and that the layers of each tile are sufficiently bonded can be an arduous and cost-prohibitive process.

Therefore, it would be desirable to have a system and method of sufficiently securing the tiles to one another in a manner to counter the delaminating or otherwise disassembly forces that act upon the tiles during magnetic field generation without substantial increases in production cost and time.

BRIEF DESCRIPTION OF INVENTION

The present invention provides a system and method to secure a single permanent magnet, constructed of a plurality of magnetic tiles and, in turn, of a plurality of sheets, from disassembly or delamination that overcomes the aforementioned drawbacks. Specifically, the present invention employs a non-magnetizable material that is secured to and extends over a surface of a magnet polepiece to restrict the plurality of magnetic tiles, or individual sheets, from separating from one another.

In accordance with one aspect of the invention, a magnetic field generator assembly is disclosed that includes a plurality of magnetic elements configured to collectively generate a magnetic field sufficient for diagnostic data acquisition, and a non-magnetizable pane operationally connected to the plurality of magnetic elements to limit separation of one magnetic element from another magnetic element.

In accordance with another aspect of the invention, an MRI apparatus is disclosed that includes a magnetic assembly having a bore therethrough, a plurality of gradient coils positioned about the bore of a magnet assembly to impress a polarizing magnetic field and an RF transceiver system, and an RF switch controlled by a pulse module to transmit RF signals to an RF coil assembly to acquire MR data. The magnetic assembly also includes at least one multi-element magnet and at least one non-magnetizable sheet connected to the at least one multi-element magnet to prevent dislocation of the magnet elements.

In accordance with another aspect of the invention, a method of manufacturing a magnet assembly for an MRI apparatus is disclosed that includes assembling a plurality of magnetic elements to form a multi-element magnet and securing a non-magnetizable element-retention sheet to the multi-element magnet so as to reduce element breakaway.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to increase the mechanical stability of an MRI permanent magnet. Specifically, the permanent magnet, constructed from a plurality of magnetic sheets bonded to form tiles that are then bonded together, is secured against disassembly of the magnetic sheets and tiles through a high-mechanical-strength, non-metallic, tile/sheet retention pane or panes.

Figure 1:
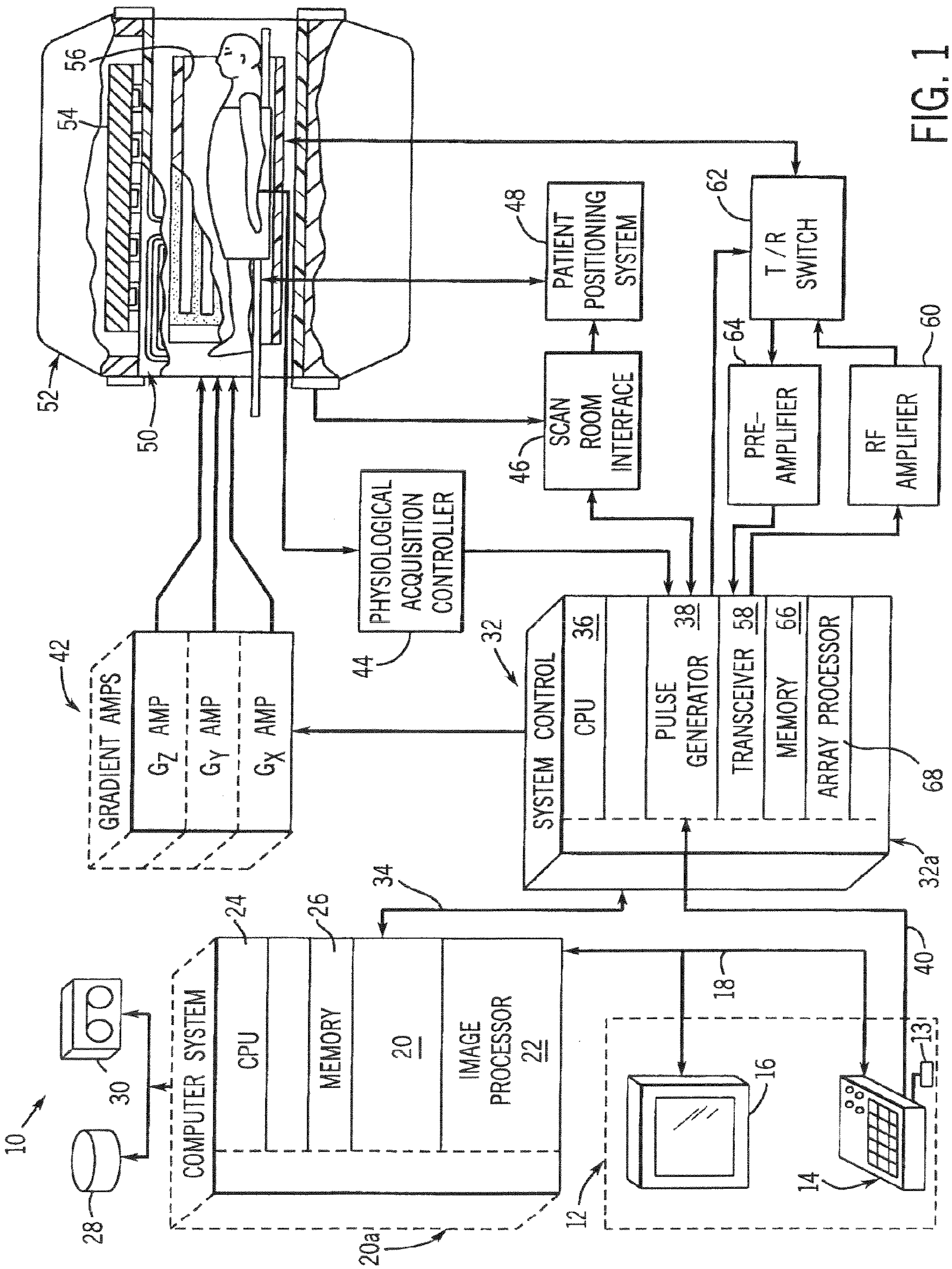
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a permanent magnet system 54 and a whole-body RF coil 56. As will be described in detail with respect to FIGS. 2 and 3, the permanent magnet system 54 includes a plurality of elements. One skilled in the art will appreciate that the system 10 may be fitted with a superconducting magnet.

A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
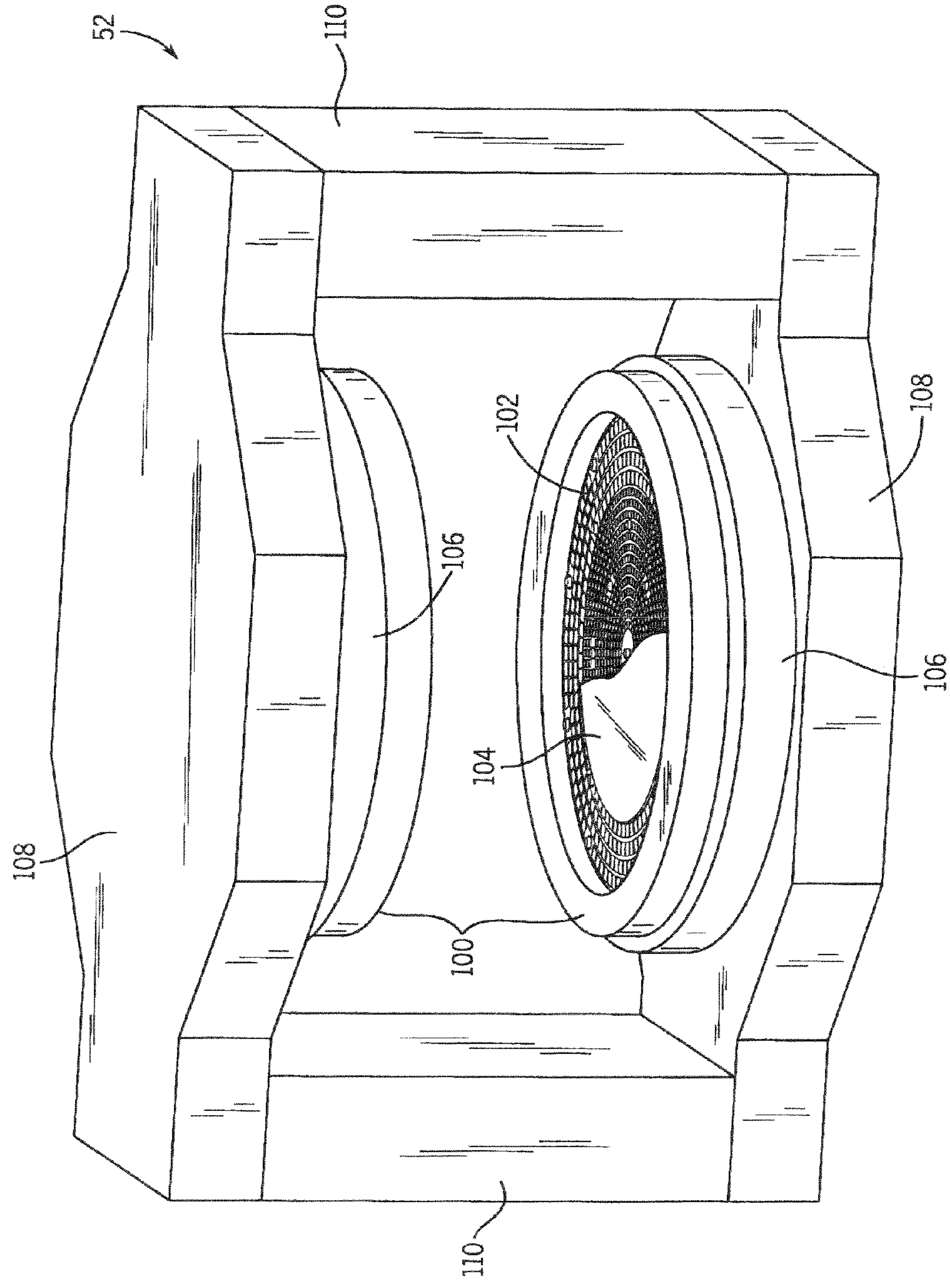
FIG. 2 is a perspective view of a permanent magnet assembly.
Figure 3:
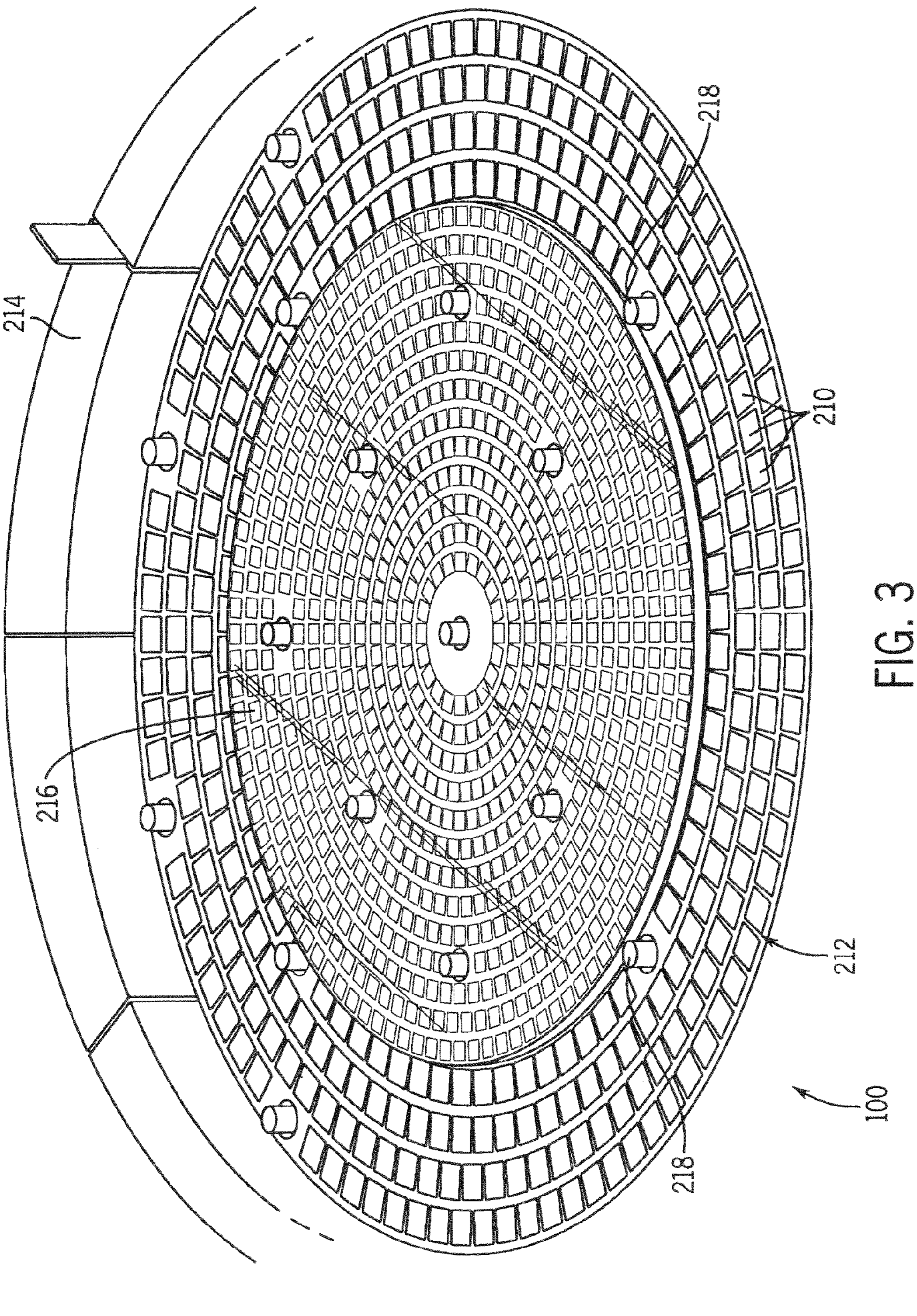
FIG. 3 is a perspective view of a multi-element magnet applicable with the permanent magnet assembly of FIG. 2 in accordance with the present invention.

Referring now to FIG. 2, a perspective view of the magnet assembly 52 is shown. The magnet assembly 52 can be broken into two identical halves that each include a polepiece 100, which, as will be shown in detail with respect to FIG. 3, is constructed by bonding a plurality of magnetic tiles 102 to a non-magnetizable pane or sheet 104. Sheet 104 is adhesively secured to the tiles 102 to prevent disassembly or deterioration of the tiles 102 that may occur as a result of prolonged exposure to magnetic field generation, for instance. The polepiece 100 is secured to a permanent material block 106, which, in turn, is fastened to an iron yoke 108. The iron yoke 108 is secured to a pair of iron posts 110 that support the identical halves of the magnet assembly 52.

When a magnetic field is generated by polepieces 100, the tiles are subjected to a strong magnetic field. Over time, if the bonding of the tiles is not sufficient to resist the forces of the magnetic field, a tile may loosen, separate, or otherwise dislodge from the polepieces 100. Simply put, prolonged exposure to higher order magnetic fields such as those required for MR imaging can cause the individual tiles to overcome their bond to adjacent tiles and ultimately "break away" from the array of magnetic elements and polepiece 100. Furthermore, as the tiles 102 are constructed from a plurality of stacked magnetic sheets of laminates, the strong magnetic field may also import a sufficient force to pull the individual sheets apart thereby, effectively delaminating a sheet from the stack of sheets that form a tile 102. The non-magnetizable pane 104 provides restraint against disassembly or delamination should the bonding of the tiles 102 or the laminates of tiles 102 be overcome. That is, the non-magnetizable pane 104 is virtually unaffected by prolonged exposure to the magnetic field and, therefore, remains effectively secured or sealed against the tiles 102 to restrain or otherwise prevent any tiles 102 or laminates from breaking away.

Referring now to FIG. 3, a detailed view of a single polepiece 200 is shown. The polepiece 200 is formed from a plurality of magnetic tiles 210 arranged in an array. The tiles are bonded together to form a single multi-element permanent magnet 212. That is, the individual permanent magnet tiles 210 are assembled together to form a single magnetic object or polepiece 200 designed to achieve a desired high uniform magnetic field in an imaging volume. Therefore, an MRI permanent magnet system is typically composed of a plurality of magnetic elements. The tiles 210 are encompassed by a structural support ring 214 to secure the tiles around the circumference of the multi-element magnet, and a layer of non-magnetizable material 216 is bonded on a top surface of the single multi-element magnet 212. Also shown in FIG. 3, support studs 218 extend through the magnet 212 and serve to support as well as an align MR gradient coil. Additionally, the non-magnetizable pane 216 is constructed with openings to accommodate the studs 218. Therefore, it is contemplated that the non-magnetizable pane 216 be pre-sized and shaped to be applied and bonded to a pre-assembled polepiece 200. Furthermore, it is contemplated that the non-magnetizable pane 216 may be secured to a polepiece and later sized and shaped.

As previously stated, the tiles 210 are constructed from a plurality of layers of a ferromagnetic magnetic material. In a single polepiece 200 there may be over two hundred tiles 210 that are bonded to form the single multi-element magnet 212. In turn, each tile 210 is formed from approximately more than one hundred layers of highly magnetic material (s). The thickness of each layer is typically less than 0.6 millimeters (mm) and preferably about 0.3 to 0.5 mm. These layers are adhesively secured or glued together to form a tile 210. The magnetic tiles and, therefore, the layers of sheets, may be composed of highly magnetic compounds such as Silicon Iron (SiFe), Neodymium Iron Boron (NdFeB), Samarium Cobalt (SmCo), Aluminum Nickel-Cobalt-Iron Cobalt (AlNiCo), and/or other iron parts.

Figure 4:
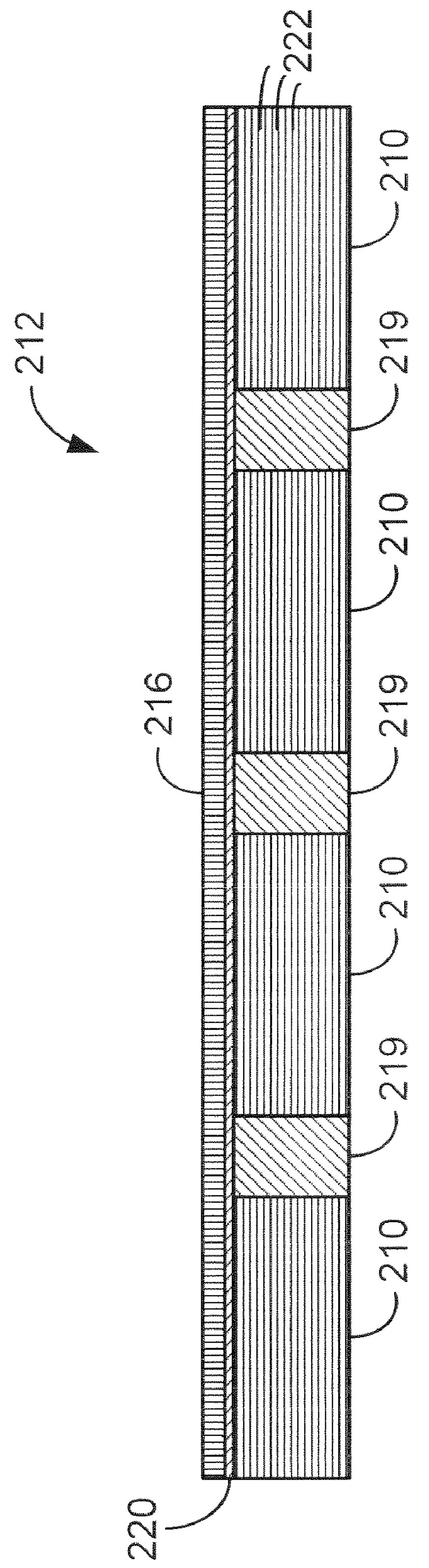
FIG. 4 is a cross-sectional view of the multi-element magnet of FIG. 3 in accordance with the present invention.

Referring now to FIG. 4, a cross-sectional view of a portion of the single multi-element permanent magnet 212 heretofore described is shown. The single multi-element permanent magnet 212 includes a plurality of tiles 210 that are bonded together via adhesive 219. Also bonded by an adhesive 220 to the tiles 210 is a layer of non-magnetizable material 216. Specifically, the non-magnetizable material 216 is formed as a continuous pane or sheet.

In accordance with a preferred embodiment of the invention, the non-magnetizable sheet 216 is one layer of nylon, preferably netting, and is adhesively assembled to an outer surface of the tiles 210. In this regard, the single layer of nylon 216 has a thickness of approximately less than 0.1 mm. One skilled is the act will appreciate that other non-magnetizable materials other than nylon may be used, are contemplated, and are considered within the scope of the invention.

To construct the single multi-element magnet 212, sheets or laminates 222 of magnetic material are bonded together to form tiles 210. The non-magnetizable sheet 216 is placed on the surface of the tiles 210. The adhesive 220, preferably a glue or derivative, is placed between the non-magnetizable sheet 216 and the surface of the tiles 210 such that the tiles 210 are bonded to one another through adhesive 219. As such, separation of laminate layers 222 or tiles from the tile array is countered by the non-magnetizable sheet 216, which secures the tiles 210 and their components against disassembly.

It is contemplated that a number of adhesive materials or bondings may be used in securing the components of the single multi-element magnet 212. Specifically, it is contemplated that combinations of glues, pastes, super-adhesives, and the like may be utilized in solo or in combination to secure the tiles to one another and to then non-magnetizable pane. Furthermore, it is contemplated that chemical bonding compositions and techniques may be utilized. Additionally, it is contemplated that the adhesives 219, 220 may be fashioned from similar bonding agents or may differ in composition to provide customized bonding in each adhesive 219, 220.

Therefore, it is contemplated that the above-described invention may be embodied in a magnetic field generator assembly that includes a plurality of magnetic elements configured to collectively generate a magnetic field sufficient for diagnostic data acquisition, and a non-magnetizable pane operationally connected to the plurality of magnetic elements to limit separation of one magnetic element from another magnetic element.

In accordance with another embodiment of the invention, it is contemplated that the above-described invention be embodied in an MRI apparatus that includes a magnetic assembly having a bore there through, a plurality of gradient coils positioned about the bore of a magnet assembly to impress a polarizing magnetic field and an RF transceiver system, and an RF switch controlled by a pulse module to transmit RF signals to an RF coil assembly to acquire MR data. The magnetic assembly also includes at least one multi-element magnet and at least one non-magnetizable sheet connected to the at least one multi-element magnet to prevent dislocation of the magnet elements.

In accordance with yet another embodiment of the invention, it is contemplated that the above-described invention be embodied as a method of manufacturing a magnet assembly for an MRI apparatus that includes assembling a plurality of magnetic elements to form a multi-element magnet and securing a non-magnetizable element-retention sheet to the multi-element magnet so as to reduce element breakaway.

The present invention has been described in terms of the preferred embodiment, and it is recognized that equivalents, alternatives, and modifications, aside from those expressly stated, are possible and within the scope of the appending claims.

What is claimed is:

1. A magnetic field generator assembly comprising:

a plurality of magnetic elements configured to collectively generate a magnetic field sufficient for diagnostic data acquisition;

a non-magnetizable pane; and an adhesive to secure the non-magnetizable pane to at least a portion of the plurality of magnetic elements.

2. The magnetic field generator assembly of claim 1 wherein the non-magnetizable pane has a thickness of less than 0.1 mm.

3. The magnetic field generator assembly of claim 1 wherein the non-magnetizable pane is adhesively secured to the plurality of magnetic elements.

4. The magnetic field generator assembly of claim 1 wherein the non-magnetizable pane includes nylon.

5. The magnetic field generator assembly of claim 1 further comprising a permanent material block secured to a collective surface of the plurality of magnetic elements opposite that of the non-magnetizable pane.

6. The magnetic field generator assembly of claim 1 wherein each of the magnetic elements has a thickness of less than 0.6 mm.

7. The magnetic field generator assembly of claim 1 wherein the plurality of magnetic elements are adhesively secured together.

8. The magnetic field generator assembly of claim 1 wherein the plurality of magnetic elements includes at least one of Silicon Iron (SiFe), neodymium iron boron (NdFeB), samarium Cobalt (SmCo), and Aluminum Nickel-Cobalt-Iron Cobalt (AlNiCo).

9. A magnetic resonance imaging (MRI) apparatus comprising:

a magnetic assembly having a bore therethrough;

a plurality of gradient coils positioned about the bore of a magnet assembly to impress a polarizing magnetic field;

an RF transceiver system and an RF switch controlled by a pulse module to transmit RF signal to an RF coil assembly to acquire MR data; and wherein the magnetic assembly includes:

at least one multi-element magnet; and at least one non-magnetizable nylon sheet connected to the at least one multi-element magnet.

10. The apparatus of claim 9 wherein the at least one non-magnetizable sheet is adhesively secured to the at least one multi-element magnet.

11. The apparatus of claim 9 further comprising at least one permanent material block and wherein the at least one multi-element magnet is secured to the at least one permanent material block.

12. The apparatus of claim 9 wherein the magnetic assembly further includes a pair of multi-element magnets and a pair of non-magnetizable sheets wherein each non-magnetizable sheet is positioned to secure one of the pair of multi-element magnets.

13. The apparatus of claim 9 wherein each non-magnetizable sheet has a thickness of approximately 0.1 mm.

14. The apparatus of claim 9 wherein each non-magnetizable sheet includes nylon, and the non-magnetizable sheet covers a top surface of a respective multi-element magnet.

15. The apparatus of claim 9 wherein the non-magnetizable sheet forms element retention netting to limit deterioration of a respective multi-element magnet.

16. A method of manufacturing a magnet elements assembly for an MRI apparatus comprising the steps of:

assembling a plurality of magnetic elements to form a multi-element magnet; and securing a non-magnetizable element-retention sheet to the multi-element magnet with an adhesive so as to reduce element breakaway.

17. The method of claim 16 further comprising the step of bonding the non-magnetizable sheet to the multi-element magnet.

18. The method of claim 17 wherein bonding includes gluing.

19. The method of claim 16 wherein the step of assembling the plurality of magnetic elements includes bonding the magnetic elements to one another.

20. The method of claim 16 further comprising the step of attaching the multi-element magnet to a permanent material block.

21. The method of claim 20 further comprising the step of attaching the permanent material block to a yoke secured by a pair of posts.

22. The method of claim 21 further comprising the step of arranging the multi-element magnet, the permanent material block, the yoke, and the pair of posts to form at least a portion of a magnetic bore of an MRI apparatus.

23. A magnetic field generator assembly comprising:

a plurality of magnetic elements configured to collectively generate a magnetic field sufficient for diagnostic data acquisition;

a non-magnetizable pane operationally connected to limit separation of one magnetic element from another magnetic element; and wherein the non-magnetizable pane has a thickness of less than 0.1 mm.

* * * * *